(12) United States Patent
Xia et al.

(10) Patent No.: US 12,034,420 B2
(45) Date of Patent: Jul. 9, 2024

(54) SWITCHING AMPLIFIER HAVING LINEAR TRANSITION TOTEM POLE MODULATION

(71) Applicant: Texas Instruments Incorporated, Dallas, TX (US)

(72) Inventors: Yinglai Xia, Plano, TX (US); Yogesh Kumar Ramadass, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/491,133

(22) Filed: Sep. 30, 2021

(65) Prior Publication Data

US 2023/0098806 A1 Mar. 30, 2023

(51) Int. Cl.
H03F 3/217 (2006.01)
H03G 3/34 (2006.01)
H03F 1/02 (2006.01)

(52) U.S. Cl.
CPC .............. *H03G 3/34* (2013.01); *H03F 3/217* (2013.01); *H03F 2200/03* (2013.01)

(58) Field of Classification Search
CPC ........ H03G 3/34; H03F 3/217; H03F 2200/03
USPC ....................................... 330/10, 207 A, 251
See application file for complete search history.

(56) References Cited

U.S. PATENT DOCUMENTS

| | | | |
|---|---|---|---|
| 5,898,340 A | 4/1999 | Chatterjee | |
| 6,078,214 A | 6/2000 | Zhang | |
| 6,249,182 B1 | 6/2001 | Pullen | |
| 6,788,137 B2 | 9/2004 | Morita | |
| 7,656,202 B2 | 2/2010 | Kaiho | |
| 7,816,981 B2 | 10/2010 | Morishima | |
| 8,283,979 B2 | 10/2012 | Stanley | |
| 8,558,609 B2 | 10/2013 | Fang | |
| 9,276,530 B1 | 3/2016 | Liu | |
| 9,473,087 B2 * | 10/2016 | Lesso | H03F 1/0211 |
| 10,367,458 B2 * | 7/2019 | Azuhata | H03F 3/2171 |
| 2006/0091945 A1 | 5/2006 | Wegner | |
| 2009/0128237 A1 | 5/2009 | Attwood et al. | |
| 2011/0133836 A1 | 6/2011 | Yu | |
| 2011/0254625 A1 | 10/2011 | Kohut et al. | |
| 2014/0203870 A1 | 7/2014 | Williams | |
| 2017/0054416 A1 | 2/2017 | Zhu et al. | |
| 2023/0004967 A1 | 2/2023 | Xia | |

OTHER PUBLICATIONS

International Search Report for PCT/US2022/044204 dated Jan. 6, 2023; 3 pages.
Written Opinion of the International Searching Authority for PCT/US2022/044204 dated Jan. 6, 2023; 4 pages.

* cited by examiner

*Primary Examiner* — Hieu P Nguyen
(74) *Attorney, Agent, or Firm* — Frank D. Cimino

(57) ABSTRACT

A switching amplifier includes a first portion of a power stage; a second portion of a power stage; a pulse-width modulation (PWM) control loop coupled to control inputs of the first portion of the power stage; and a linear amplifier coupled to control inputs of the second portion of the power stage. The PWM control loop controls a first switch and a second switch of the first portion of the power stage. Between current terminals of the first switch and the second switch is a first signal output of the switching amplifier. The linear amplifier controls a third switch and a fourth switch of the second portion of the power stage. Between current terminals of the third switch and the fourth switch is a second signal output of the switching amplifier.

26 Claims, 11 Drawing Sheets

SWITCHING AMPLIFIER HAVING LINEAR TRANSITION TOTEM POLE MODULATION

BACKGROUND

As new electronic devices are developed and integrated circuit (IC) technology advances, new IC products are commercialized. One example IC product for electronic devices is an analog signal chain or related switching amplifier (e.g., a class D amplifier). In some examples, the analog signal chain is part of an audio system to control volume or equalization of an audio signal to be output to a speaker.

Switching amplifiers with low switching loss, low harmonic distortion, and low electromagnetic interference are desirable to provide the best sound qualities for audio playback. An example switching amplifier topology includes: a power stage having high-side and low-side switches for each output (e.g., OUTP and OUTM); and a modulation control circuit configured to provide control signals for each switch of the power stage. Different modulation control circuit options vary with regard to performance and/or cost to implement.

In one conventional approach, the modulation control circuit performs "BD" or filterless modulation. With BD modulation, the duty cycle of the difference of the output signals is modulated so that its average value matches the input analog signal. Also, the bridge-tied load (BTL) outputs are in phase with each other when idle, not complimentary. This results in zero voltage difference across the load, minimizing the quiescent power consumption without the need of a filter. With BD modulation, there is significant common-mode content in the output, and a costly LC filter is added to remove the switching component in the speaker cable.

In another conventional approach, the modulation control circuit performs totem pole low-side recycle (LSR) modulation. With totem pole LSR modulation, OUTP and OUTM will have toggling around zero-crossing to ensure good total harmonic distortion (THD). If the toggling time is very short (only around the zero-crossing), then the electromagnetic interference (EMI) pulses will be small and an LC filter on OUTM is not needed. However, the minimum on-time for driver switches is limited. If the input signal is very low (always around the zero-crossing), the duty cycle will be less than 10% and there will be a lot of pulses on OUTM. This switching activity for OUTM consumes power. Also, totem pole LSR modulation introduces "pop" noises when OUTM transitions from a switching state to a low-dropout regulator (LDO) direct-current (DC) voltage.

SUMMARY

In one example embodiment, a switching amplifier comprises a first portion of a power stage. The first portion includes: a first control input; a second control input; a first switch having a first control terminal coupled to the first control input; and a second switch having a second control terminal coupled to the second control input. The switching amplifier also comprises a second portion of a power stage. The second portion includes: a third control input; a fourth control input; a third switch having a third control terminal coupled to the third control input; and a fourth switch having a fourth control terminal coupled to the fourth control input. The switching amplifier further comprises: a first signal output between current terminals of the first switch and the second switch; and a second signal output between current terminals of the third switch and the fourth switch. The switching amplifier additionally comprises a pulse-width modulation (PWM) control loop having a first source signal input, a second source signal input, a first feedback input coupled to the first signal output, a second feedback input coupled to the second signal output, a first PWM control loop output coupled to the first control input, and a second PWM control loop output coupled to the second control input. The switching amplifier also comprises a linear amplifier having an amplifier input, a first amplifier output and a second amplifier output. The amplifier input is coupled to the second source signal input. The first amplifier output is coupled to the third control input. The second amplifier output is coupled to the fourth control input.

In another example embodiment, a system comprises a switching amplifier having a first source signal input, a second source signal input, a first signal output, and a second signal output. The switching amplifier is configured to provide a first output signal at the first signal output based on a PWM control loop that receives a first source signal from the first source signal input, a second source signal from the second source signal input, a first feedback signal from the first signal output, and a second feedback signal from the second signal output. The switch amplifier is further configured to provide a second output signal at the second signal output based on a linear amplifier and the second source signal. The system also comprises a load coupled to the first signal output and the second signal output via filter circuitry.

In yet another example embodiment, a method for use with a switching amplifier having a first signal output and a second signal output is described. The method comprises: receiving a first voltage at a first source signal input and a second voltage at a second source signal input; providing a first output signal at the first signal output based on a PWM control loop that receives the first voltage, the second voltage, a first feedback signal from the first signal output, and a second feedback signal from the second signal output; and providing a second output signal at the second signal output based on a linear amplifier and the second voltage.

DETAILED DESCRIPTION

Described herein is a switching amplifier having a power stage, a pulse-width modulation (PWM) control loop, and a linear amplifier. The PWM control loop controls a first switch and a second switch in a first portion of the power stage. Between current terminals of the first switch and the second switch is a first signal output of the switching amplifier. The linear amplifier controls a third switch and a fourth switch in a second portion of the power stage. Between current terminals of the third switch and the fourth switch is a second signal output of the switching amplifier. The topology of the described switching amplifier is sometimes referred to herein as a linear transition totem pole topology. As used herein, a "linear transition totem pole" topology refers to a switching amplifier topology having a high frequency output (e.g., $V_{OUTP}$ herein) and a low frequency output (e.g., $V_{OUTM}$ herein). Around zero crossing of an input signal, the low frequency output will transition in a slow linear way to reduce or eliminate total harmonic distortion (THD) for the switching amplifier. Another feature of the linear transition totem pole topology is that the low frequency output is clamped (e.g., $V_{OUTM}$ greater than a threshold is clamped to 0 or a power supply voltage "PVDD").

With the linear transition totem pole topology, filter circuitry between a load and the first and second signal outputs of the switching amplifier avoids an inductor, which reduces the overall system expense. In some example embodiments, the filter circuitry includes a first filter and a second filter. The first filter is between the first signal output and a first end of the load. In some example embodiments, the first filter includes a first capacitor and an inductor. The second filter is between the second signal output and a second end of the load. In some example embodiments, the second filter includes a second capacitor and no inductor. In some example embodiments, the system is an electronic device having a speaker as the load. In some example embodiments, the PWM control loop receives a feedforward signal based on a voltage at the second signal output, where the feedforward signal improves THD of the switching amplifier. As another option, the size and charging interval of the second capacitor of the filter circuitry is selected to reduce switching losses of the switching amplifier.

Figure 1:
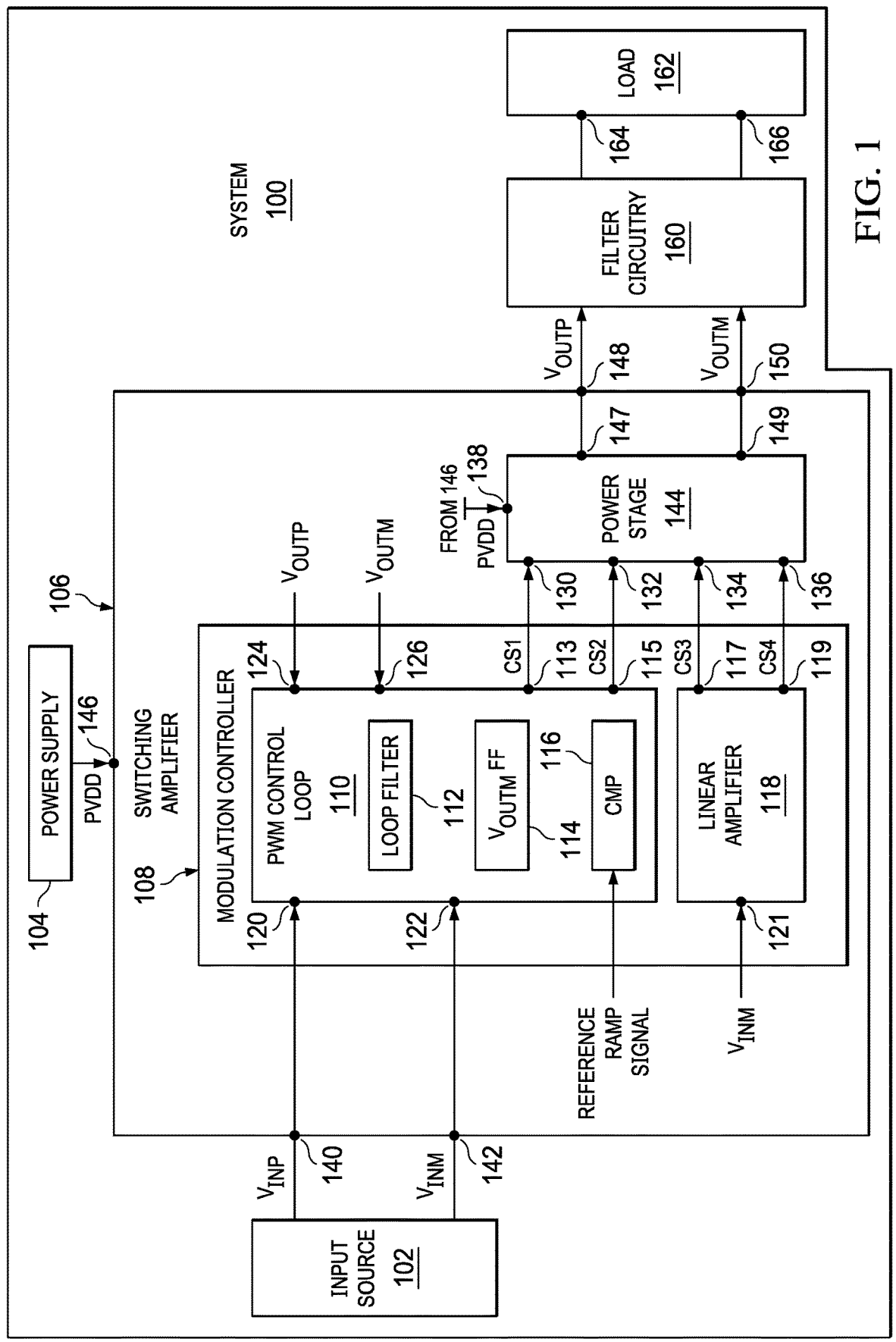
FIG. 1 is a block diagram of a system having a switching amplifier in accordance with an example embodiment.

The same reference numbers (or other reference designators) are used in the drawings to designate the same or similar (structurally and/or functionally) features. FIG. 1 is a block diagram of a system 100 having a switching amplifier in accordance with an example embodiment. In some example embodiments, the system 100 is an electronic device (e.g., a smartphone, laptop computer, or other electronic device) having an audio subsystem and analog signal chain. As shown, the system 100 includes an input source 102 configured to provide a first source signal ($V_{INP}$) to a first source signal input 140 of a switching amplifier 106. The input source 102 is also configured to provide a second source signal ($V_{INM}$) to a second source signal input 142 of the switching amplifier 106. In some example embodiments, the input source 102 includes a DAC or other source of analog audio signals. The system 100 further includes a power supply 104 configured to provide PVDD to a respective PVDD input 146 of the switching amplifier 106. The switching amplifier 106 also includes a first signal output 148 and a second signal output 150.

In the example of FIG. 1, the switching amplifier 106 includes a power stage 144 having a first control input 130, a second control input 132, a third control input 134, and a fourth control input 136. The power stage 144 also includes: a power supply input 138 coupled to the PVDD input 146 of the switching amplifier 106; a first power stage output 147 coupled to the first signal output 148; and a second power stage output 149 coupled to the second signal output 150.

In the example of FIG. 1, the switching amplifier 106 also includes a modulation controller 108 configured to provide a first control signal (CS1) to the first control input 130, a second control signal (CS2) to the second control input 132, a third control signal (CS3) to the third control input 134, and a fourth control signal (CS4) to the fourth control input 136. These control signals (CS1, CS2, CS3, CS4) control respective switches (see e.g., S1-S4 in FIG. 3) of the power stage 144.

In some example embodiments, the modulation controller 108 includes a PWM control loop 110 having a loop filter 112 and compare circuitry 116. As shown, the PWM control loop 110 includes a first input 120 coupled to the first source signal input 140; a second input 122 coupled to the second source signal input 142; a first feedback input 124 coupled to the first signal output 148, and a second feedback input 126 coupled to the second signal output 150. The loop filter 112 is configured to integrate the difference between voltages at the first and second source signal inputs 140 and 142 relative to voltages at the first and second signal outputs 148 and 150 (i.e., integrate the difference between $V_{INP}$ and $V_{INM}$ relative to the difference between $V_{OUTP}$ and $V_{OUTM}$). The output of the loop filter 112 is provided to the compare circuitry 116, which compares the output of the loop filter 112 having a reference ramp signal. The comparison result is used to generate CS1 and CS2 at PWM control loop outputs 113 and 115. In some example embodiments, $V_{OUTM}$ feedforward (FF) circuitry 114 is in the PWM control loop 110. In such case, the $V_{OUTM}$ feedforward circuitry 114 is configured to adjust the results of the PWM control loop 110 based on $V_{OUTM}$. For example, the $V_{OUTM}$ feedforward circuitry 114 may add $V_{OUTM}$ or a scaled version of $V_{OUTM}$ to the loop filter output. In such case, the compare circuitry 116 uses the sum of the loop filter output and the feedforward signal as one of its inputs. With the $V_{OUTM}$ feedforward circuitry 114, the THD of the switching amplifier 106 is improved relative to a switching amplifier 106 without the $V_{OUTM}$ feedforward circuitry 114.

In the example of FIG. 1, the modulation controller 108 also includes a linear amplifier 118 having an amplifier input 121, a first amplifier output 117, and a second amplifier output 119. In some example embodiments, the linear amplifier 118 is configured to provide CS3 at the first amplifier output 117 and CS4 at the second amplifier output 119 based on $V_{INM}$ and a gain of the linear amplifier 118. In response to CS1, CS2, CS3, and CS4, the power stage 144 controls the voltage ($V_{OUTP}$) at the first signal output 148 and the voltage ($V_{OUTM}$) at the second signal output 150.

With the modulation controller 108, filter circuitry 160 (e.g., to reduce electromagnetic interference or "EMI") between a load 162 and the first and second signal outputs 148 and 150 is simplified relative to other filter options because the number of inductors in the filter circuitry 160 is reduced (e.g., from 2 inductors to 1 inductor). The filter 160 circuitry includes, for example, a first filter and a second filter. The first filter is between the first signal output 148 and a first end 164 of the load 162. In some example embodiments, the first filter includes a first capacitor (e.g., C1 in FIGS. 2 and 3) and an inductor (e.g., L1 in FIGS. 2 and 3). The second filter is between the OUTM output 150 and a second end 166 of the load 162. In some example embodiments, the second filter includes a second capacitor (e.g., C2 in FIGS. 2 and 3) and no inductor.

This simplification of the filter circuitry 160 is a significant cost reduction due to the size of inductors. To improve performance of the switching amplifier 106, the PWM control loop 110 may receive a feedforward signal based on $V_{OUTM}$ as described herein, which improves THD of the switching amplifier 106. As another option, the size and charging interval of the second capacitor (e.g., C2 in FIGS. 2 and 3) of the filter circuitry 160 is selected to reduce switching losses of the switching amplifier 106.

Figure 2:
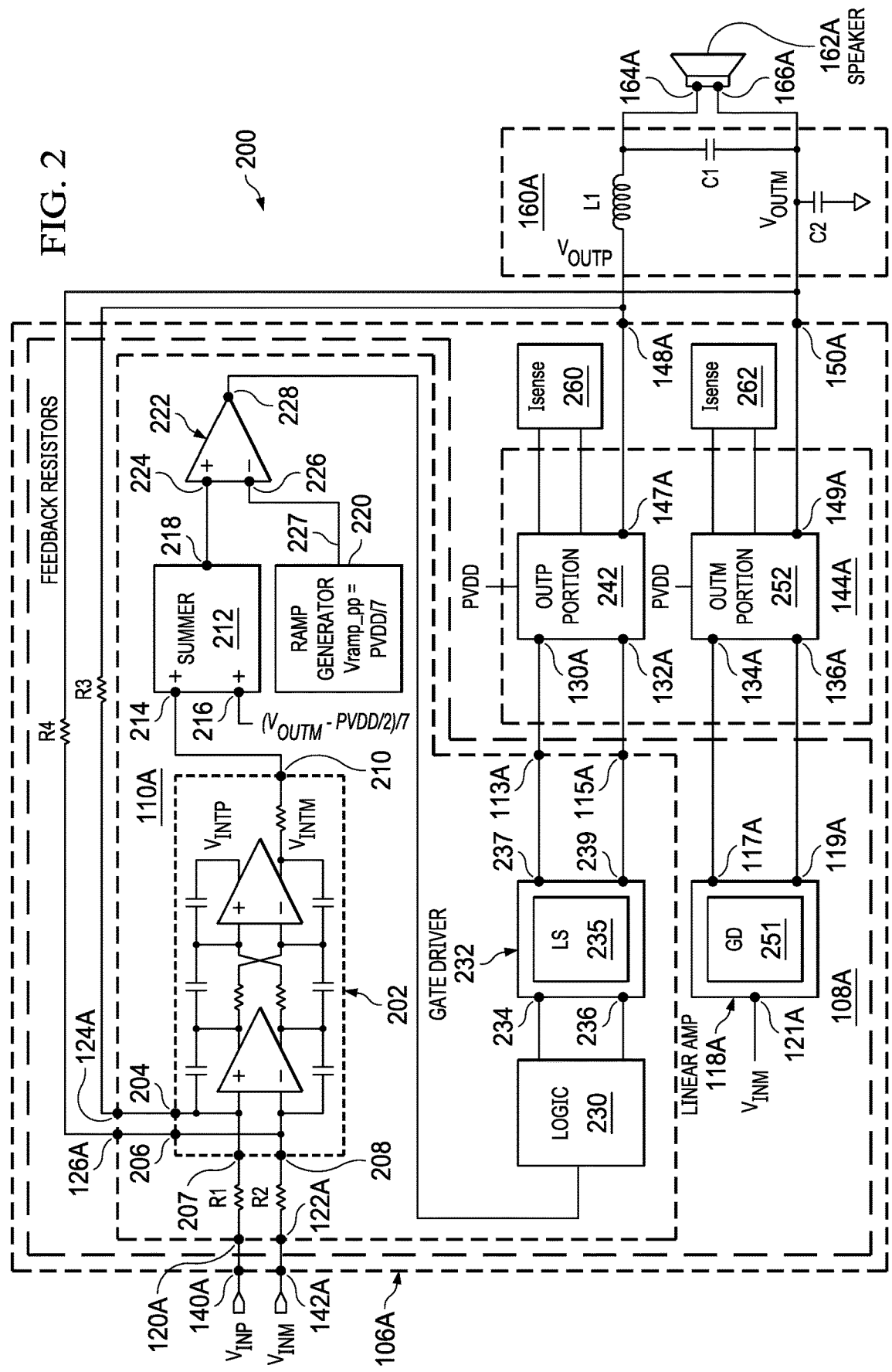
FIG. 2 is a block diagram of an audio system having a switching amplifier in accordance with an example embodiment.

FIG. 2 is a block diagram of an audio system 200 having a switching amplifier 106A (an example of the switching amplifier 106 in FIG. 1) in accordance with an example embodiment. The audio system 200 may be part of a system (e.g., the system 100 in FIG. 1) having audio signal amplification provided by the switching amplifier 106A. As shown, the audio system 200 includes the switching amplifier 106A coupled to a speaker 162A (an example of the load 162 in FIG. 1) via filter circuitry 160A (an example of the filter circuitry 160 in FIG. 1).

In the example of FIG. 2, the switching amplifier 106A includes a modulation controller 108A (an example of the modulation controller 108 in FIG. 1) having a PWM control loop 110A (an example of the PWM control loop 110 in FIG. 1) and a linear amplifier 118A (an example of the linear amplifier 118 in FIG. 1). The PWM control loop 110A and the linear amplifier 118A are coupled to a power stage 144A (an example of the power stage 144 in FIG. 1). More specifically, the power stage 144A includes a first portion 242 (labeled "OUTP portion") and a second portion 252 (labeled "OUTM portion"). The first portion 242 of the power stage 144A includes a first control input 130A (an example of the first control input 130 in FIG. 1), and a second control input 132A (an example of the second control input 132 in FIG. 1). In some example embodiments, the first portion 242 of the power stage 144A includes: a first switch (e.g., S1 in FIG. 3) having a first control terminal (e.g., CT1 in FIG. 3) coupled to the first control input 130A; and a second switch (e.g., S2 in FIG. 3) having a second control terminal (e.g., CT2 in FIG. 3) coupled to the second control input 132A. The second portion 252 of the power stage 144A includes a third control input 134A (an example of the third control input 134 in FIG. 1), and a fourth control input 136A (an example of the fourth control input 136 in FIG. 1). In some example embodiments, the second portion 252 of the power stage 144A includes: a third switch (e.g., S3 in FIG. 3) having a third control terminal (e.g., CT3 in FIG. 3) coupled to the third control input 134A; and a fourth switch (e.g., S4 in FIG. 3) having a fourth control terminal (e.g., CT4 in FIG. 3) coupled to the fourth control input 136A.

In the example of FIG. 2, the switching amplifier 106A also includes a first signal output 148A (an example of the first signal output 148 in FIG. 1). As shown, the first signal output 148A is coupled to a first power stage output 147A (an example of the first power stage output 147 in FIG. 1) of the first portion 242 of the power stage 144A. In some example embodiments, the first power stage output 147A and thus the first signal output 148 are between current terminals of a first switch (e.g., S1 in FIG. 3) and a second switch (e.g., S2 in FIG. 3) of the first portion 242 of the power stage 144A.

The switching amplifier 106A further includes a second signal output 150A (an example of the second signal output 150 in FIG. 1). As shown, the second signal output 150A is coupled to a second power stage output 149A (an example of the second power stage output 149 in FIG. 1) of the second portion 252 of the power stage 144A. In some example embodiments, the second power stage output 149A and thus the second signal output 150A are between current terminals of a third switch (e.g., S3 in FIG. 3) and a fourth switch (e.g., S4 in FIG. 3) of the second portion 252 of the power stage 144A.

In FIG. 2, the PWM control loop 110A includes a first input 120A (an example of the first input 120 in FIG. 1) coupled to a first source signal input 140A (an example of the first source signal input 140 in FIG. 1) and receiving a first source signal (e.g., $V_{INP}$). The PWM control loop 110A further includes a second input 122A (an example of the second input 122 in FIG. 1) coupled to a second source signal input 142A (an example of the second source signal input 142 in FIG. 1) and receiving a second source signal (e.g., $V_{INM}$). The PWM control loop 110A additionally includes: a first feedback input 124A (an example of the first feedback input 124 in FIG. 1) coupled to the first signal output 148A; and a second feedback input 126A (an example of the second feedback input 126 in FIG. 1) coupled to the second signal output 150A. The PWM control loop 110A further includes a first PWM control loop output 113A (an example of the first PWM control loop output 113 in FIG. 1) coupled to the first control input 130A; and a second PWM control loop output 115A (an example of the second PWM control loop output 115 in FIG. 1) coupled to the second control input 132A.

As shown, the linear amplifier 118A has an amplifier input 121A (an example of the amplifier input 121), a first amplifier output 117A (an example of the first amplifier output 117 in FIG. 1), and a second amplifier output 119A (an example of the second amplifier output 119 in FIG. 1). The amplifier input 121A is coupled to the second source signal input 142A to receive $V_{INM}$. The first amplifier output 117A is coupled to the third control input 134A. The second amplifier output 119A is coupled to the fourth control input 136A.

In the example of FIG. 2, the switching amplifier 106A also includes: a first resistor (R1) between the first source signal input 140A and the first feedback input 124A; a second resistor (R2) between the second source signal input 142A and the second feedback input 126A; a third resistor (R3) between the first feedback input 124A and the first signal output 148A; and a fourth resistor (R4) between the second feedback input 126A and the second signal output 150A. With the resistors R1, R2, R3, and R4, a loop filter 202 of the PWM control loop 110A operates using scaled versions of $V_{INP}$, $V_{INM}$, $V_{OUTP}$, and $V_{OUTM}$.

As shown, the loop filter 202 includes a first filter input 204, a second filter input 206 and a filter output 210. The first filter input 204 is coupled to the first feedback input 124A, and the second filter input 206 is coupled to the second feedback input 126A. In operation, the loop filter 202 is configured to integrate the difference between $V_{INP}$ and $V_{INM}$ relative to the difference between $V_{OUTP}$ and $V_{OUTM}$, resulting in $V_{INTP}$ and $V_{INTM}$. In some example embodiments, the PWM control loop 110A further includes a summer 212 having a first summer input 214, a second summer input 216, and a summer output 218. The first summer input 214 is coupled to the filter output 210, which provides $V_{INTM}$. The second summer input 216 receives a feedforward signal based on a voltage (e.g., $V_{OUTM}$) at the second signal output 150A. Without limitation, an example feedforward signal is $$\frac{(V_{OUTM} - PVDD/2)}{7}.$$

The PWM control loop 110A may also include a comparator 222 (an example of the compare circuitry 116 in FIG. 1) having a first comparator input 224, a second comparator input 226 and a comparator output 228. The first comparator input 224 is coupled to the summer output 218. The second comparator input 226 receives a reference ramp signal 227 (e.g., PVDD/7). The reference ramp signal 227 is provided, for example, by a ramp generator 220.

In the example of FIG. 2, the PWM control loop 110A additionally includes a gate driver circuit 232 coupled to the comparator output 228. In some example embodiments, logic 230 is between the comparator output 228 and the gate driver circuit 232. The logic 230 is sometimes referred to as non-overlapping logic. In operation, the logic 230 ensures there is a deadtime between control signals (e.g., CS1 and CS2) output from the gate driver 232 to prevent shoot-through current in the low-side and high-side switches (e.g., S3 and S4) of the second portion 252 of the power stage 144A.

The gate driver circuit 232 includes a first gate driver input 234, a second gate driver input 236, a first gate driver output 237, and a second gate driver output 239. The first gate driver input 234 and the second gate driver input 236 are coupled to the comparator output 228 (via the logic 230). The first gate driver output 237 is coupled to the first PWM control loop output 113A. The second gate driver output 239 is coupled to the second PWM control loop output 115A. In some example embodiments, the gate driver circuit 232 includes level shifter circuitry 235 to shift a voltage/current level to provide gate drive control signals (e.g., CS1 and CS2 in FIG. 1).

In some example embodiments, the linear amplifier 118A is configured to apply a gain to an input signal (e.g., $V_{INM}$) from the second source signal input 142A. Without limitation, the gain may be at least 160. The gain selection involves a tradeoff between THD and loss. If the gain is lower, the low power linear loss will be higher because the linear transition region will take a longer time and THD will be improved. If the gain is higher, THD will be worse but low power linear loss will be smaller. As another option, the linear amplifier 118A is configured to clamp an output signal (e.g., $V_{OUTM}$) at the second signal output 150A. Thus, when $V_{INM}$ is above a threshold, the linear amplifier 118A: causes the high-side switch (e.g., S3 in FIG. 3) controlling $V_{OUTM}$ to be fully on such that $V_{OUTM}$ will be clamped to PVDD, or causes the low-side switch (e.g., S4 in FIG. 4) controlling $V_{OUTM}$ to be fully on such that $V_{OUTM}$ will be clamped to ground.

In the example of FIG. 2, the first signal output 148A of the switching amplifier 106A is adapted to be coupled to a first end 164A (an example of the first end 164 of the load 162 in FIG. 1) of a speaker 162A via a first filter of the filter circuitry 160A. In some example embodiments, the first filter includes C1 and L1 in the arrangement shown. The second signal output 150A of the switching amplifier 106A is adapted to be coupled to a second end 166A (an example of the first end 166 of the load 162 in FIG. 1) of the speaker 162A via a second filter of the filter circuitry 162A. In some example embodiments, the second filter includes C2 in the arrangement shown and no inductor. In some example embodiments, the switching amplifier 106A may also include a current sense circuit 260 configured to monitor a current through the switches of the first portion 242 of the power stage 144A. Also, the switching amplifier 106A may include a current sense circuit 262 configured to monitor a current through the switches of the second portion 252 of the power stage 144A. The current second circuits 260 and 262 may be part of an overcurrent or undercurrent monitoring system for the switching amplifier 106A.

With the audio system 200, the topology of the switching amplifier 106A enables the filter circuitry 160A to be simplified relative to other topologies (an inductor can be omitted). Also, the feedforward signal based on $V_{OUTM}$ (e.g., applied at the summer 212) improves THD of the switching amplifier 106A. Also, the size of C2 and a related charging interval may be selected to reduce switching losses of the switching amplifier 106A.

In some example embodiments, a system (e.g., the system 100 in FIG. 1) includes a switching amplifier (e.g., the switching amplifier 106 in FIG. 1, or the switching amplifier 106A in FIG. 2) having: a first signal source input (e.g., the first source signal input 140 in FIG. 1, or the first source signal input 140A in FIG. 2); a second source signal input (e.g., the second source signal input 142 in FIG. 1, or the second source signal input 142A in FIG. 2); a first signal output (e.g., the first signal output 148 in FIG. 1, or the first signal output 148A in FIG. 2), and a second signal output (e.g., the second signal output 150 in FIG. 1, or the second signal output 150A in FIG. 2). The switching amplifier is configured to provide a first output signal (e.g., $V_{OUTP}$) at the first signal output based on a PWM control loop (e.g., the PWM control loop 110 in FIG. 1, or the PWM control loop 110A in FIG. 2) that receives: a first source signal (e.g., $V_{INP}$) from the first source signal input; a second source signal (e.g., $V_{INM}$) from the second source signal input; a first feedback signal (e.g., $V_{OUTP}$ or a scaled version of $V_{OUTP}$) from the first signal output; and a second feedback signal (e.g., $V_{OUTM}$ or a scaled version of $V_{OUTM}$) from the second signal output. The switching amplifier is further configured to provide a second output signal (e.g., $V_{OUTM}$) at the second signal output based on a linear amplifier (e.g., the linear amplifier 118 in FIG. 1) and the second source signal at the second source signal input. The system also includes a load (e.g., the load 162 in FIG. 1, or the load 162A in FIG. 2) coupled to the first signal output and the second signal output via filter circuitry (e.g., the filter circuitry 160 in FIG. 1).

In some example embodiments, the switching amplifier includes a first resistor (e.g., R1 in FIG. 2) having a first end and a second end. The first end of the first resistor is coupled to the first source signal input, and the second end of the first resistor is coupled to a first feedback input of the PWM control loop. The switching amplifier also includes a second resistor (e.g., R2 in FIG. 2) having a first end and a second end. The first end of the second resistor is coupled to the second source signal input, and the second end of the second resistor is coupled to a second feedback input of the PWM control loop. The switching amplifier further includes a third resistor (e.g., R3 in FIG. 2) having a first end and a second end. The first end of the third resistor is coupled to the first signal output, and the second end of the third resistor is coupled to the first feedback input. The switching amplifier additionally includes a fourth resistor (e.g., R4 in FIG. 2) having a first end and a second end. The first end of the fourth resistor is coupled to the second signal output, and the second end of the fourth resistor is coupled to the second feedback input.

In some example embodiments, the PWM control loop is configured to: generate a loop filter output (e.g., the output of the loop filter 202 in FIG. 2) based on the first source signal, the second source signal, the first feedback signal, and the second feedback signal; generate a summed value (e.g., the output of the summer 212 in FIG. 2) of the loop filter output and a feedforward signal that is based on a voltage (e.g., $V_{OUTM}$) at the second signal output; and determine a comparison result (e.g., the output of the comparator 222 in FIG. 2) of the summed value and a reference ramp signal.

Figure 3:
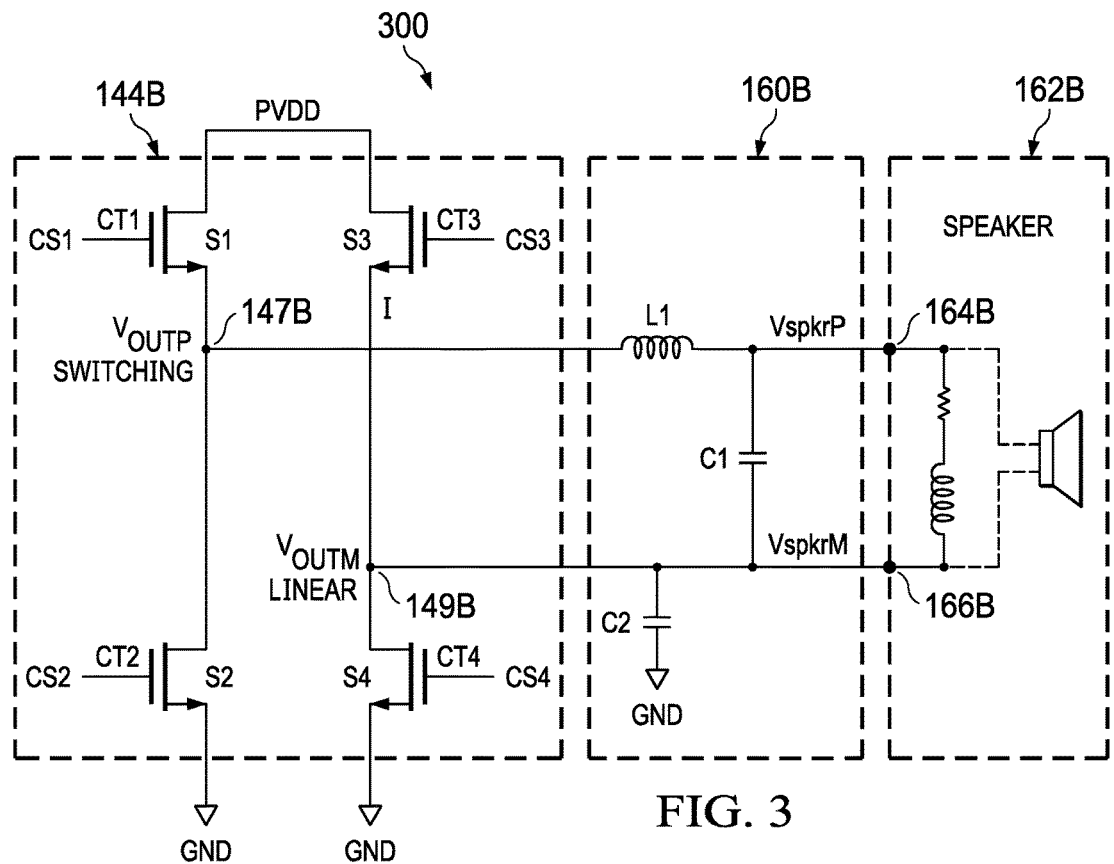
FIG. 3 is a schematic diagram of a power stage of a switching amplifier coupled to a load via filter circuitry in accordance with an example embodiment.

In some example embodiments, the switching amplifier includes a first portion of a power stage (e.g., the power stage 144B in FIG. 3) having a first set of switches (e.g., S1 and S2 in the arrangement shown in FIG. 3). In such example embodiments, the PWM control loop includes a gate driver circuit (e.g., the date driver circuit 232 in FIG. 2) configured to generate drive signals (e.g., CS1 and CS2 in FIGS. 1 and 3) for the first set of switches (e.g., S1 and S2 in FIG. 3) based on the comparison result. In some example embodiments, the gate driver circuit includes level shifter circuitry (e.g., the level shifter circuitry 235 in FIG. 2).

In some example embodiments, the switching amplifier includes a second portion of a power stage (e.g., the power stage 144B in FIG. 3) having a first set of switches (e.g., S3 and S4 in the arrangement shown in FIG. 3). In such example embodiments, the linear amplifier is configured to apply a gain to the second source signal to generate drive signals (e.g., CS3 and CS4 in FIGS. 1 and 3) for the second set switches, where the gain is at least 100. The linear amplifier may also be configured to clamp the second output signal at the second signal output.

In some example embodiments, the filter circuitry (e.g., the filter circuitry 160 in FIG. 1, or the filter circuitry 162 in FIG. 2) includes a first filter (e.g., L1 and C1 in the arrangement shown for FIG. 2 or 3) and a second filter (e.g., C2 in the arrangement shown for FIG. 2 or 3). The first filter is between the first signal output and a first end of the load. In some example embodiments, the first filter includes a first capacitor and an inductor. The second filter is between the second signal output and a second end of the load. In some example embodiments, the second filter includes a second capacitor (e.g., C2) and no inductor. In some example embodiments, a size of the second capacitor and a related charging interval are selected to reduce switching losses of the switching amplifier. In some example embodiments, the load is a speaker, and the first and second source signals are an audio signal.

FIG. 3 is a schematic diagram 300 of a power stage 144B (an example of the power stage 144 in FIG. 1, or the power stage 144A in FIG. 2) of a switching amplifier (e.g., the switching amplifier 106 in FIG. 1, or the switching amplifier 106A in FIG. 2) coupled to a load 162B (an example of the load 162 in FIG. 1, or the load 162A in FIG. 2) via filter circuitry 160B (an example of the filter circuitry 160 in FIG. 1, or the filter circuitry 160A in FIG. 2) in accordance with an example embodiment. In the example of FIG. 3, the power stage 144B includes four switches (S1, S2, S3, S4) in the form of n-type metal-oxide semiconductor field-effect (nMOSFET or just "nMOS") transistors.

As shown, a first current terminal of S1 is coupled to PVDD, a second current terminal of S1 is coupled to a first current terminal of S2, and a second current terminal of S2 is coupled to ground. Also, a control terminal (CT1) of S1 is configured to receive CS1, and a control terminal (CT2) of S2 is configured to receive CS2. As shown, a first power stage output 147B (an example of the first power output 147 in FIG. 1, or the first power stage output 147A in FIG. 2) is between the second current terminal of S1 and the first current terminal of S2. In FIG. 3, S1 and S2 in the arrangement shown are an example of the first portion 242 of the power stage 144A in FIG. 2.

Also, a first current terminal of S3 is coupled to PVDD, a second current terminal of S3 is coupled to a first terminal of S4, and a second current terminal of S4 is coupled to ground. Also, a control terminal (CT3) of S3 is configured to receive CS3, and a control terminal (CT4) of S4 is configured to receive CS4. As shown, a second power stage output 149B (an example of the second power stage output 149 in FIG. 1, or the second power stage 149A in FIG. 2) is between the second current terminal of S3 and the first current terminal of S4. In FIG. 3, S3 and S4 in the arrangement shown are an example of the second portion 252 of the power stage 144A in FIG. 2.

In example of FIG. 3, the load 162B is a speaker having a resistive and capacitive load in series. As shown, a first end of the load 162B is coupled to the first power stage output 147B via the filter circuitry 160B, which includes L1, C1, and C2. More specifically, the first power stage output 147B is coupled to a first end of L1, while a second end of L1 is coupled to the first end of the load 162B. Also, the second end of the load 162B is coupled to the second power stage output 149B via the filter circuitry 160B. Also, the second power stage output 149B is coupled to the second end of the load 162B and to a first terminal of C2. The second terminal of C2 is coupled to ground. In the example of FIG. 3, a first terminal of C1 is coupled to the second end of L1, and a second terminal of C1 is coupled to the first terminal of C2.

For the example of FIG. 3, CS1 and CS2 are provided by a PWM control loop (e.g., the PWM control loop 110 in FIG. 1, or the PWM control loop 110A in FIG. 2), resulting in switching behavior for $V_{OUTP}$ at the first power stage output 147B. Also, CS3 and CS4 are provided by a linear amplifier (e.g., the linear amplifier 118 in FIG. 1, or the linear amplifier 118A in FIG. 2), resulting in linear behavior for $V_{OUTM}$ at the second power stage output 149B.

Providing CS1, CS2, CS3, and CS4 using a linear transition totem pole topology as described herein enables the filter circuitry 160B to be simplified relative to other switching amplifier topologies (an inductor can be omitted). As desired, a feedforward signal based on $V_{OUTM}$ (e.g., applied to a summer such as the summer 212 in FIG. 2) improves THD of a switching amplifier having a linear transition totem pole topology. As another option, the size of C2 and a related charging interval may be selected to reduce switching losses of a switching amplifier having a linear transition totem pole topology.

Figure 4:
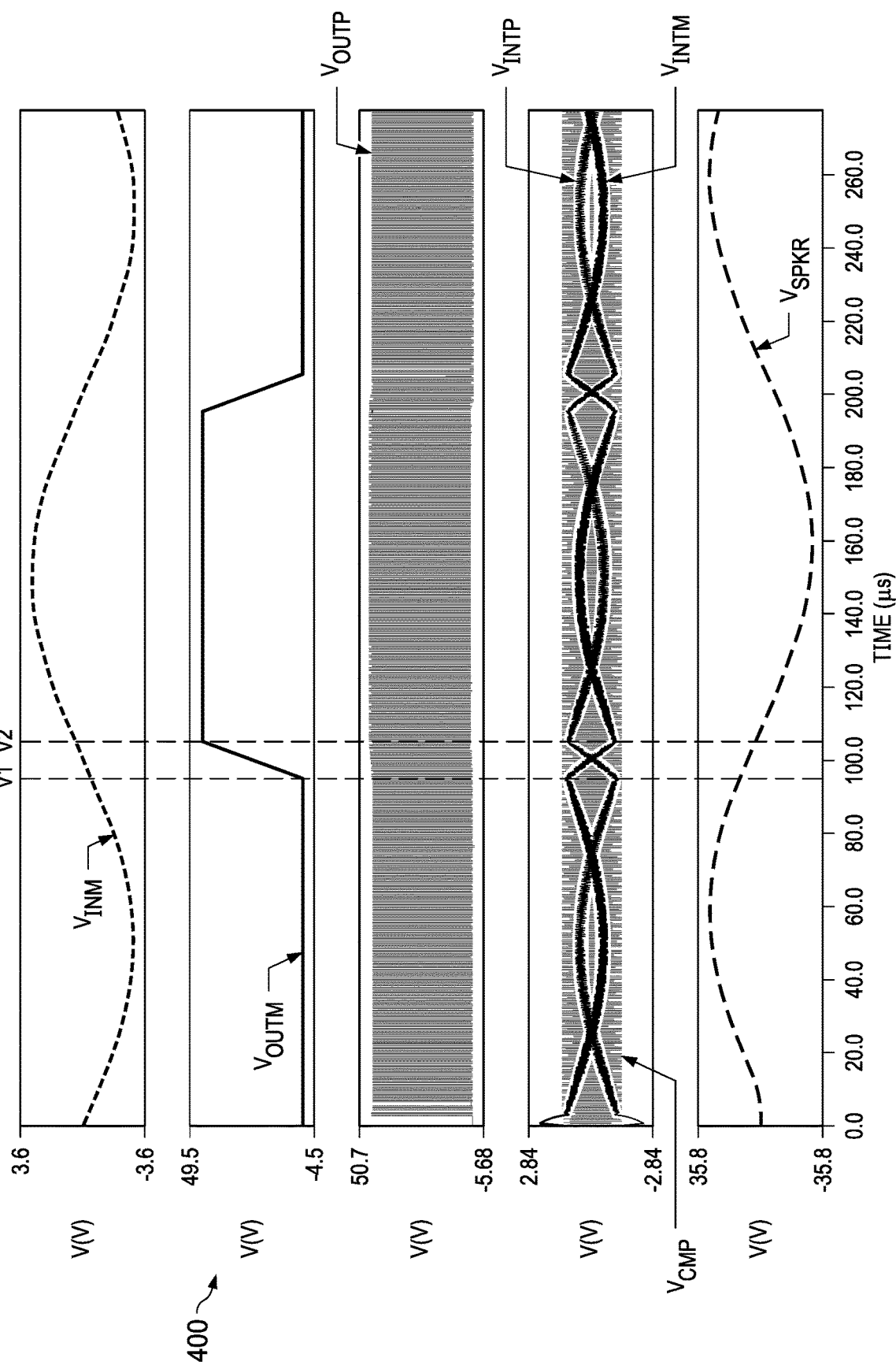
FIG. 4 is a diagram of signals related to a switching amplifier in accordance with an example embodiment.

FIG. 4 is a diagram 400 of signals related to a switching amplifier (e.g., the switching amplifier 106 in FIG. 1, the switching amplifier 106A in FIG. 1) in accordance with an example embodiment. In the diagram 400, the signals include $V_{INM}$, $V_{OUTM}$, $V_{OUTP}$, $V_{net0174}$, $V_{INTM}$, $V_{INTP}$, and $V_{net065}$. As described herein, $V_{INM}$ is an input voltage to a second source signal input (e.g., the second source signal input 142 in FIG. 1, or the second source signal input 142A in FIG. 2) of a switching amplifier. $V_{OUTM}$ is an output voltage at a second signal output (e.g., the second signal output 150 in FIG. 1, or the second signal output 150A in FIG. 2) of a switching amplifier. $V_{OUTP}$ is the output voltage at the first signal output (e.g., the first signal output 148 in FIG. 1, or the first signal output 148A in FIG. 2) of a switching amplifier. $V_{INTP}$ is a first loop filter output signal. $V_{INTP}$ is a second loop filter output signal. $V_{CMP}$ is a high frequency (e.g., 2.1 MHz) signal (e.g., a triangle wave) that is compared with $V_{INTP}$ and $V_{INTM}$ to generate CS1 and CS2. $V_{SPKR}$ is the voltage across the speaker (the output signal from the switching amplifier). As shown in the diagram 400, $V_{OUTM}$ follows the shape of $V_{INM}$, except $V_{INM}$ is sinusoidal while $V_{OUTM}$ is more linear and clamped.

Figure 5:
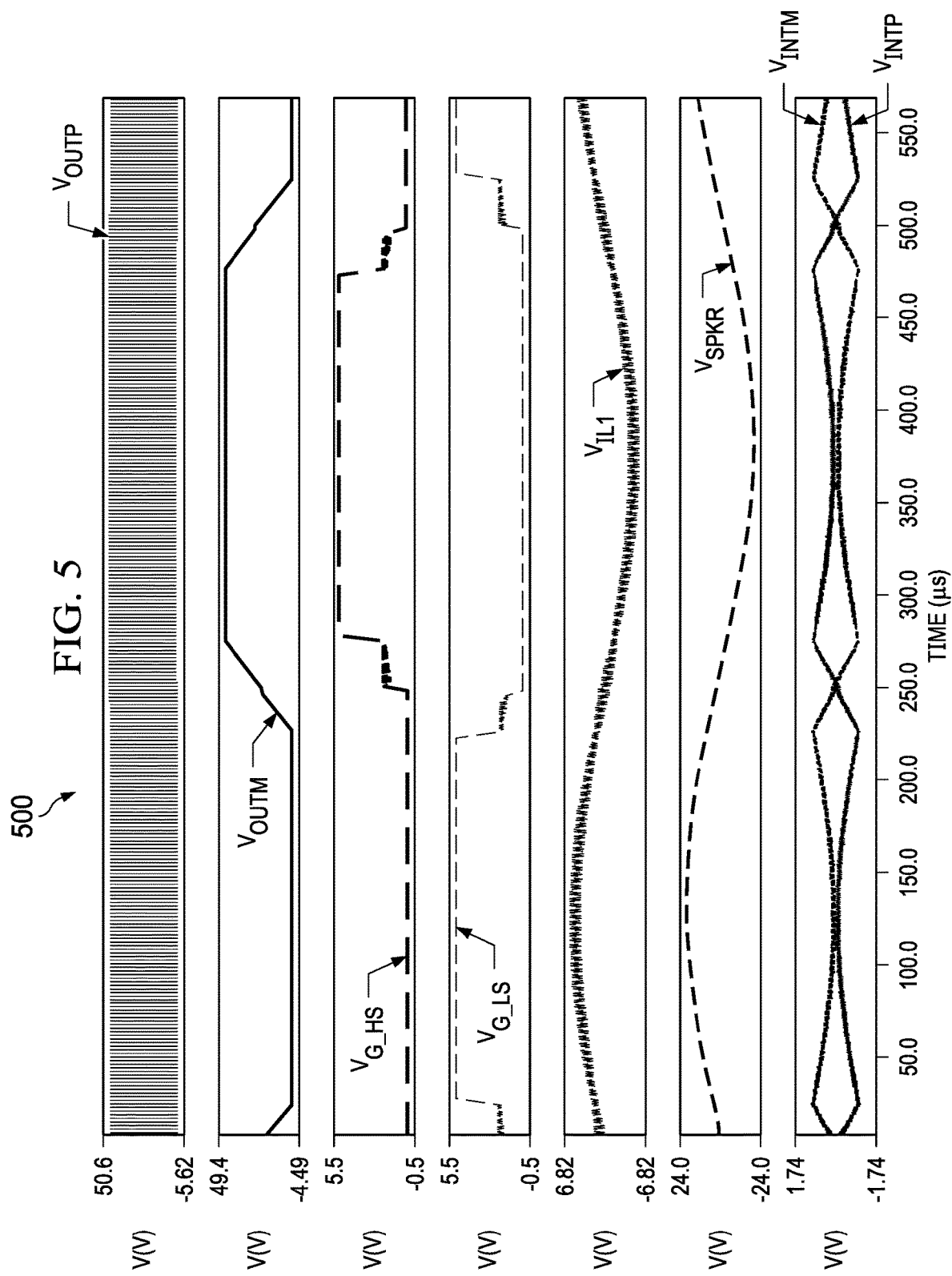
FIG. 5 is another diagram of signals related to a switching amplifier in accordance with an example embodiment.

FIG. 5 is another diagram 500 of signals related to a switching amplifier (e.g., the switching amplifier 106 in FIG. 1, the switching amplifier 106A in FIG. 1) in accordance with an example embodiment. In the diagram 500, the signals include $V_{OUTP}$, $V_{OUTM}$, $V_{G\_HS}$, $V_{G\_LS}$ $V_{L2/PLUS}$, $V_{SPKR}$, $V_{INTM}$, and $V_{INTP}$. $V_{G\_HS}$ is the high-side switch control signal (e.g., CS3) related to a second signal output for a switching amplifier. $V_{G\_LS}$ is the low-side switch control signal (e.g., CS4) related to second signal output for a switching amplifier. $V_{IL1}$ is a voltage that represent an inductor current measured through L1. As shown in the diagram 500, the approximately linear rising and falling slopes of $V_{OUTM}$ are based on multi-step values for $V_{G\_HS}$ and $V_{G\_LS}$.

Figure 6:
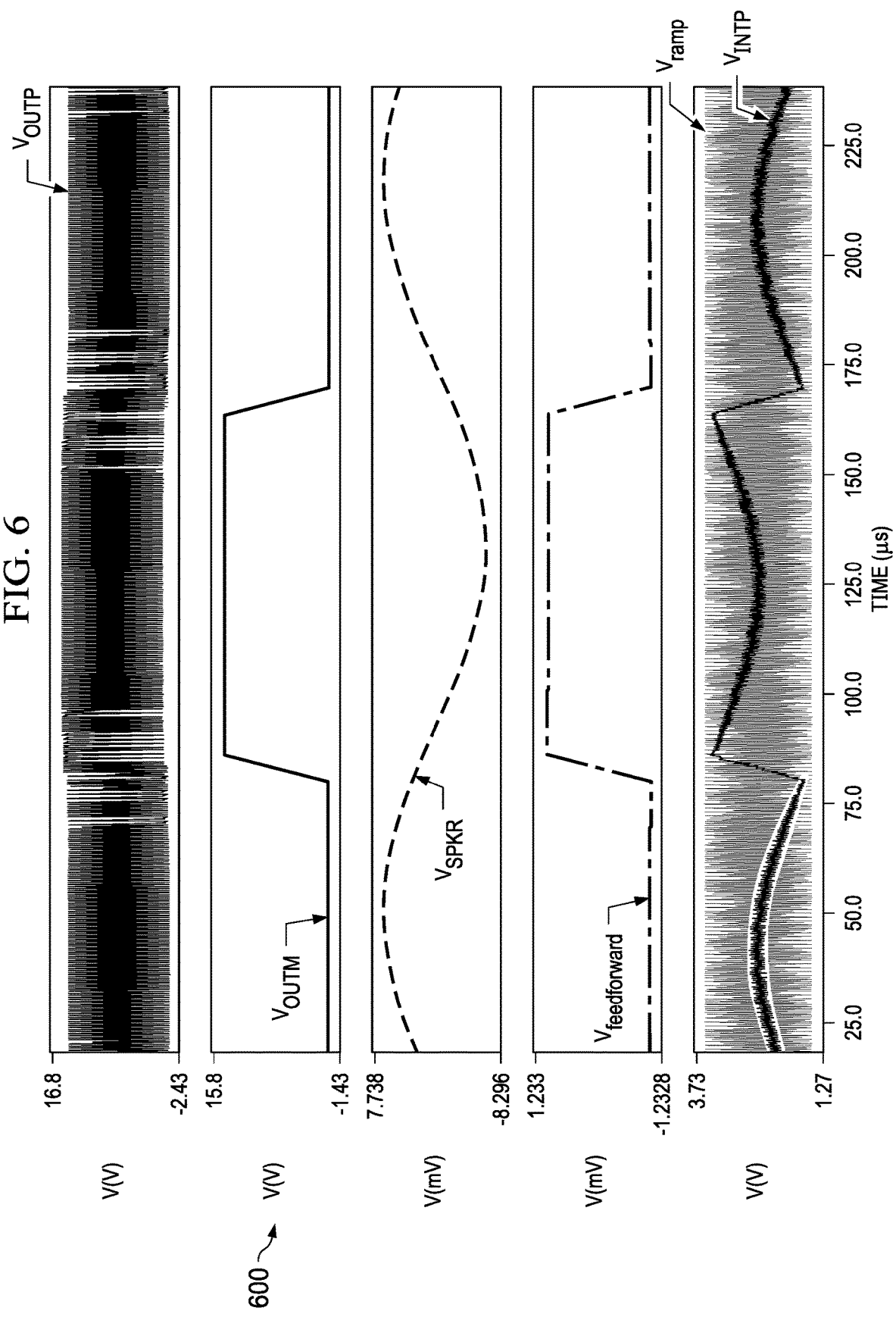
FIG. 6 is a diagram of signals related to a switching amplifier having feedforward signaling in accordance with an example embodiment.

FIG. 6 is a diagram 600 of signals related to a switching amplifier (e.g., the switching amplifier 106 in FIG. 1, the switching amplifier 106A in FIG. 1) having feedforward signaling in accordance with an example embodiment. In the diagram 600, the signals include $V_{OUTP}$, $V_{OUTM}$, $V_{SPKR}$, $V_{feedforward}$, $V_{ramp}$, and $V_{INTP}$. As shown in the diagram 600, $V_{feedforward}$ is a scaled version of $V_{OUTM}$, where $V_{OUTM}$ is approximately linear and is clamped.

Figure 7:
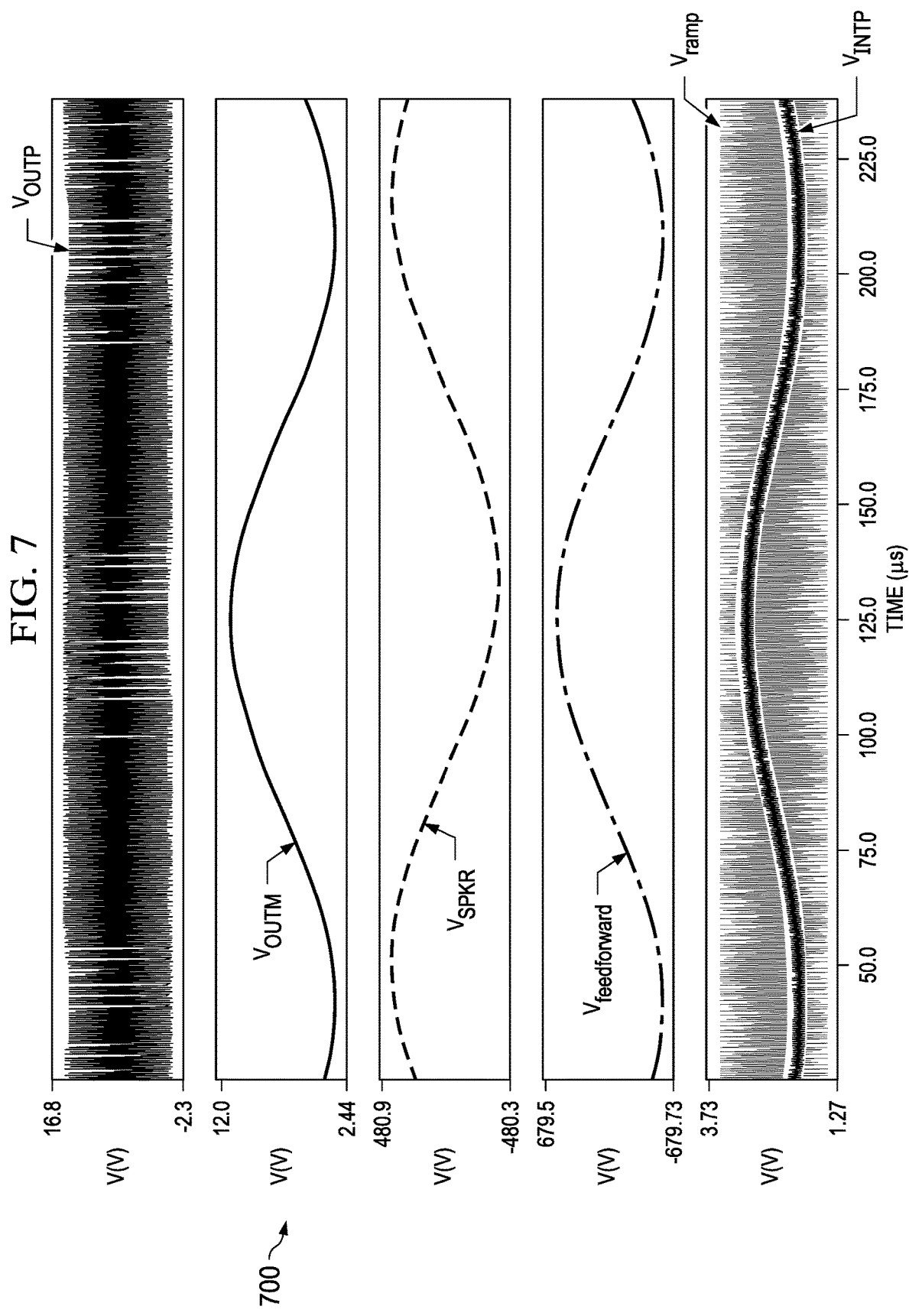
FIG. 7 is another diagram of signals related to a switching amplifier having feedforward signaling in accordance with an example embodiment.

FIG. 7 is another diagram 700 of signals related to a switching amplifier (e.g., the switching amplifier 106 in FIG. 1, the switching amplifier 106A in FIG. 1) having feedforward signaling in accordance with an example embodiment. In the diagram 700, the signals include $V_{OUTP}$, $V_{OUTM}$, $V_{SPKR}$, $V_{feedforward}$, $V_{ramp}$, and $V_{INTP}$. As shown in the diagram 700, $V_{feedforward}$ is a scaled version of $V_{OUTM}$, where $V_{OUTM}$ is approximately sinusoidal.

Figure 8:
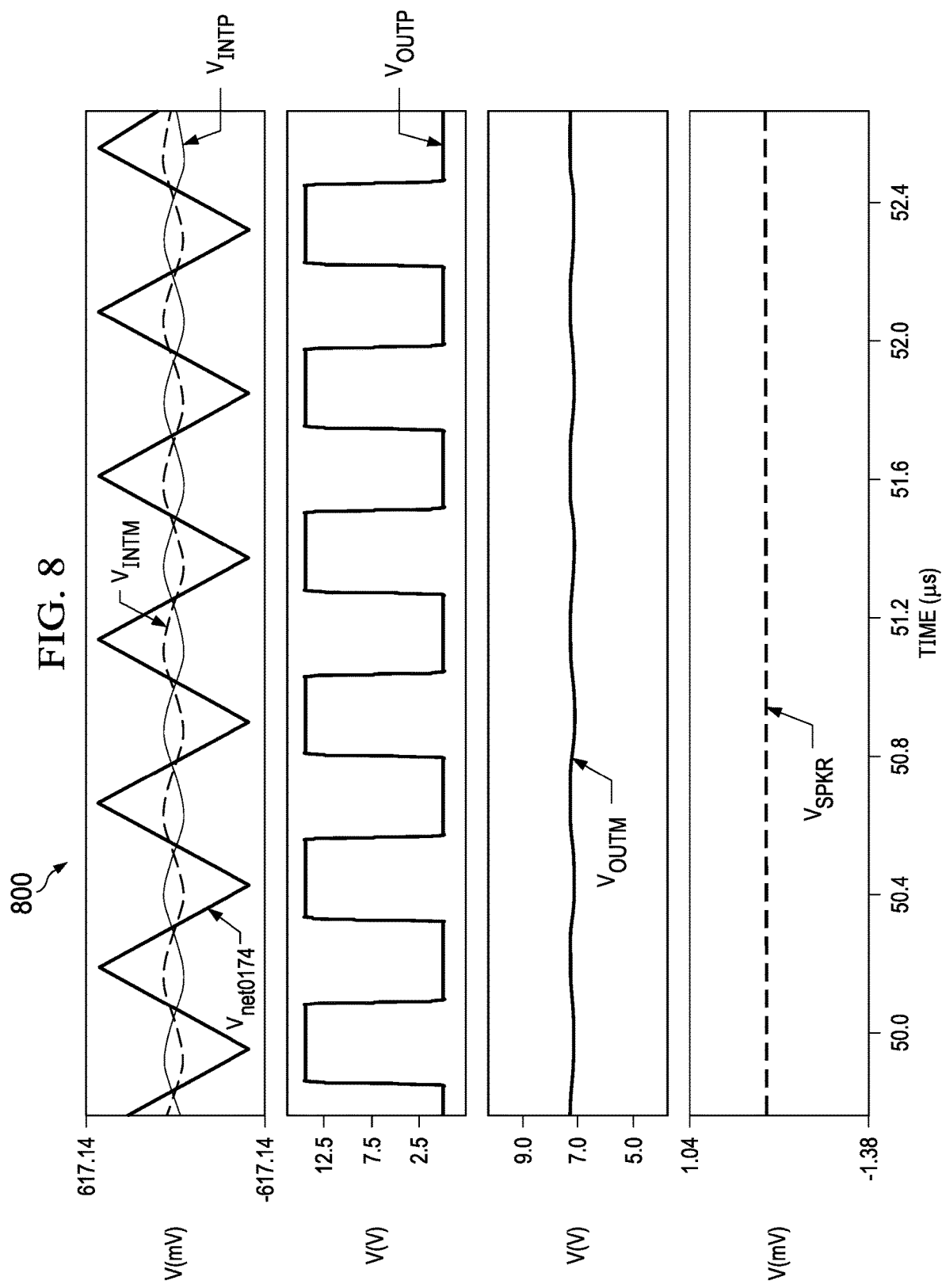
FIG. 8 is a diagram of signals related to a switching amplifier in an idle state in accordance with an example embodiment.

FIG. 8 is a diagram 800 of signals related to a switching amplifier (e.g., the switching amplifier 106 in FIG. 1, the switching amplifier 106A in FIG. 1) in an idle state in accordance with an example embodiment. In the diagram 800, the signals include $V_{CMP}$, $V_{INTP}$, $V_{INTM}$, $V_{OUTP}$, $V_{OUTM}$, and $V_{SPKR}$. As shown in the diagram 800, the input signal is 0 (an idle mode) and so the $V_{SPKR}$ should also be 0. During an idle mode, $V_{OUTM}$ is controlled to be PVDD/2 (e.g., if PVDD=14.4V, $V_{OUTM}$=7.2V), and the PWM control loop will control $V_{OUTP}$ to have close to 50% duty cycle. The average of $V_{OUTP}$ will be same as $V_{OUTM}$, resulting in zero audio frequency voltage ($V_{OUTP}-V_{OUTM}$=0) across the speaker (after the LC filter of the filter circuitry).

Figure 9A:
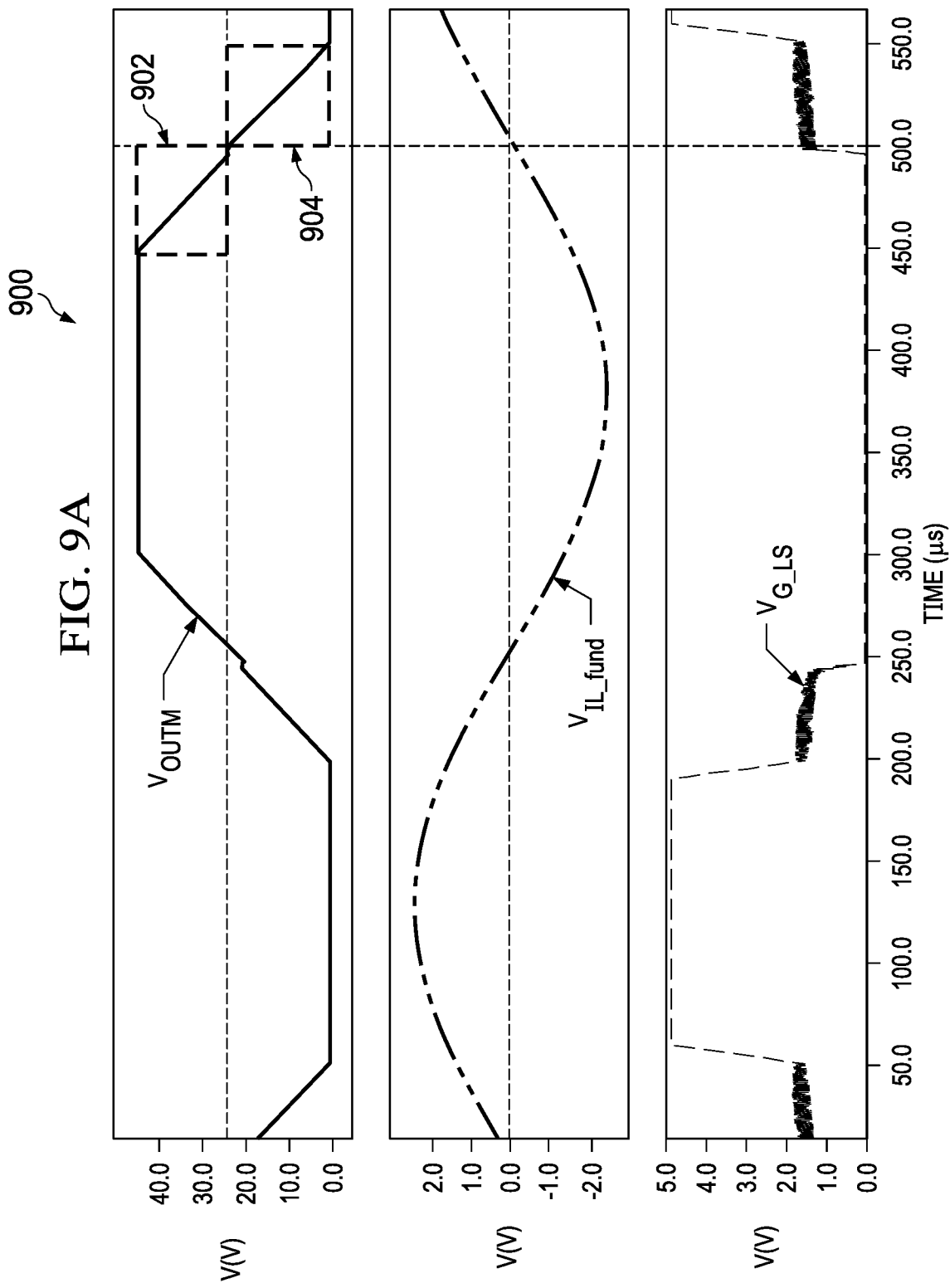
FIG. 9A is a diagram of signals related to a switching amplifier and showing switching losses in accordance with an example embodiment.

FIG. 9A is a diagram 900 of signals related to a switching amplifier (e.g., the switching amplifier 106 in FIG. 1, the switching amplifier 106A in FIG. 1) and showing switching losses in accordance with an example embodiment. In the diagram 900, the signals include $V_{OUTM}$, $V_{IL\_fund}$, and $V_{G\_LS}$. $V_{IL\_fund}$ is an inductor current at the left side of L1. As shown, $V_{OUTM}$ includes a first portion 902 and a second portion 904. The first portion 902 of $V_{OUTM}$ relates to a charging interval for C2 of the filter circuitry based on inductor current. A second portion 904 of $V_{OUTM}$ relates to a charging interval for C2 of the filter circuitry based on switching current, which is less efficient.

With diagram 900, losses on C2 are related to the second portion 904 of $V_{OUTM}$. This is because the voltage on C2 will be PVDD when $V_{OUTM}$ is PVDD or 0 when $V_{OUTM}$ is 0. If the inductor current is not in the correct direction, C2 may have losses of $C2*V_{OUTM}^2$. This is referred to as a hard-charging state for C2. If the voltage on C2 decreases due to the inductor current as in the first portion 902 of $V_{OUTM}$, losses are avoided. This is referred to as a soft-charging state for C2. More specifically, in the first portion 902 of $V_{OUTM}$, the voltage on C2 is decreasing and the L1 current is negative. The current is therefore flowing from a second power stage output (e.g., the second power stage output 149 in FIG. 1, the second power stage output 149A in FIG. 2, or the second power stage output 149B in FIG. 3) back to the first power stage output (e.g., the first power stage output 147 in FIG. 1, the first power stage output 147A in FIG. 2, or the first power stage output 147B in FIG. 3), resulting in the charge of C2 being pulled out by L1. This first portion 902 of $V_{OUTM}$ thus corresponds to a soft-charging state for C2. In the second portion 904, the voltage on C2 is decreasing and the inductor current is positive, which means the current flows to the second power stage output. Accordingly, in the second portion 904 of $V_{OUTM}$, voltage changes on C2 are due to a low-side switch (e.g., S3) being turned on, which can be seen with $V_{G\_LS}$. This second portion 904 of $V_{OUTM}$ thus relates to a hard-charging state for C2 with related losses.

Figure 9B:
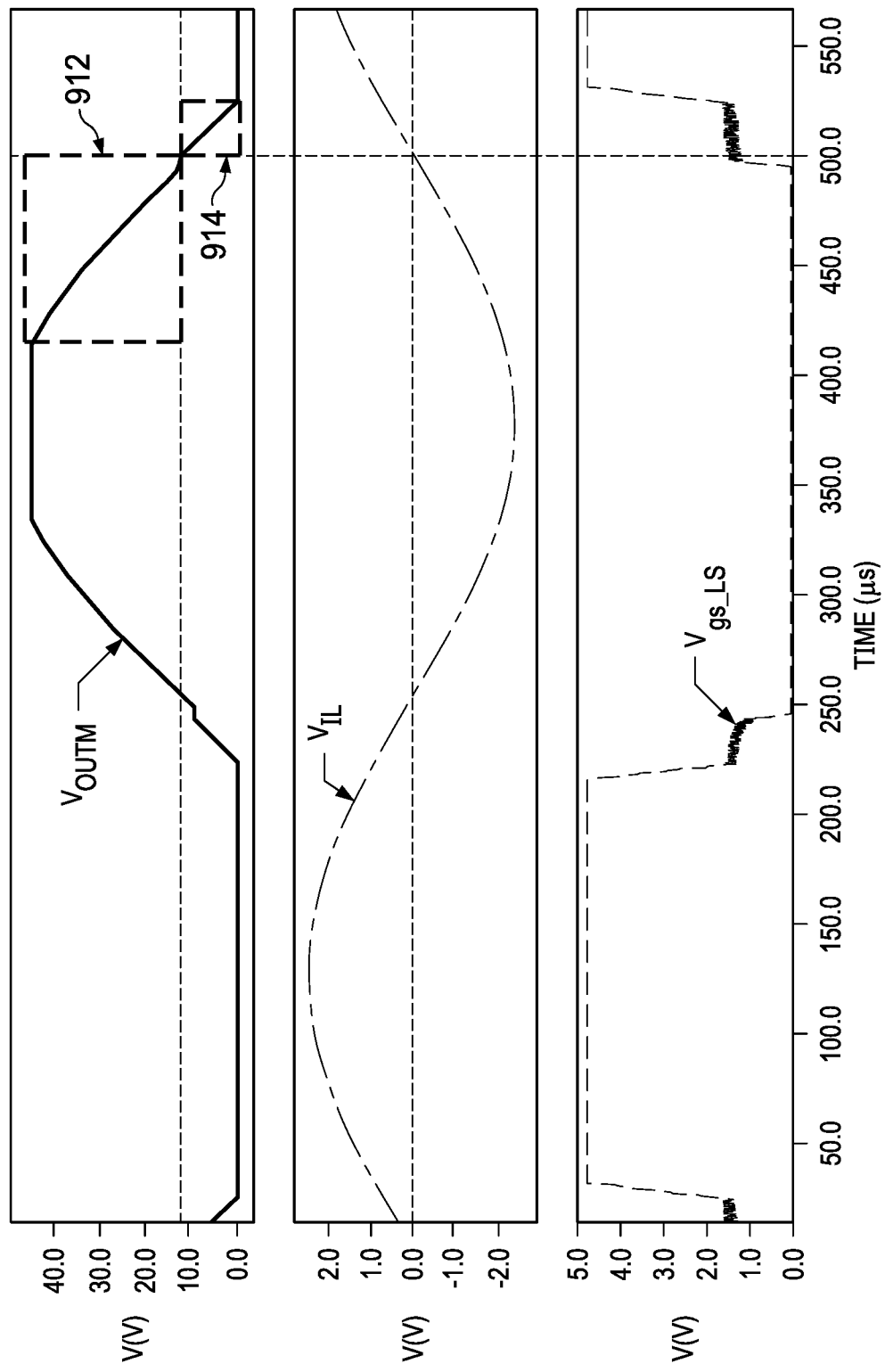
FIG. 9B is a diagram of signals related to a switching amplifier and showing reduced switching losses in accordance with an example embodiment.

FIG. 9B is a diagram 910 of signals related to a switching amplifier (e.g., the switching amplifier 106 in FIG. 1, the switching amplifier 106A in FIG. 1) and showing reduced switching losses in accordance with an example embodiment. In the diagram 910, the signals include $V_{OUTM}$, $V_{IL\_fund}$, and $V_{G\_LS}$. A first portion 912 of $V_{OUTM}$ relates to a charging interval for C2 of the filter circuitry based on inductor current. A second portion 914 of $V_{OUTM}$ relates to a charging interval for C2 of the filter circuitry based on switching current, which is less efficient. By controlling the size of C2 and the related charging intervals represented by the first and second portions 912 and 914, switching losses of a switching amplifier can be reduced. More specifically, in the first portion 912 of $V_{OUTM}$, inductor current is measured at the left side of L1. If the inductor current is positive that means the current is flowing from the first power stage output to the second power stage output. To increase the size of first portion of $V_{OUTM}$ (to make the soft-charging interval as large as possible), the voltage of $V_{OUTM}$ is changed during idle mode (when Vin=0), so that the size of the first portion 912 of $V_{OUTM}$ is increased relative to the second portion 914. Note: the first portion 912 of $V_{OUTM}$ in diagram 910 is larger than the first portion 902 of $V_{OUTM}$ in the diagram 900.

Figure 10:
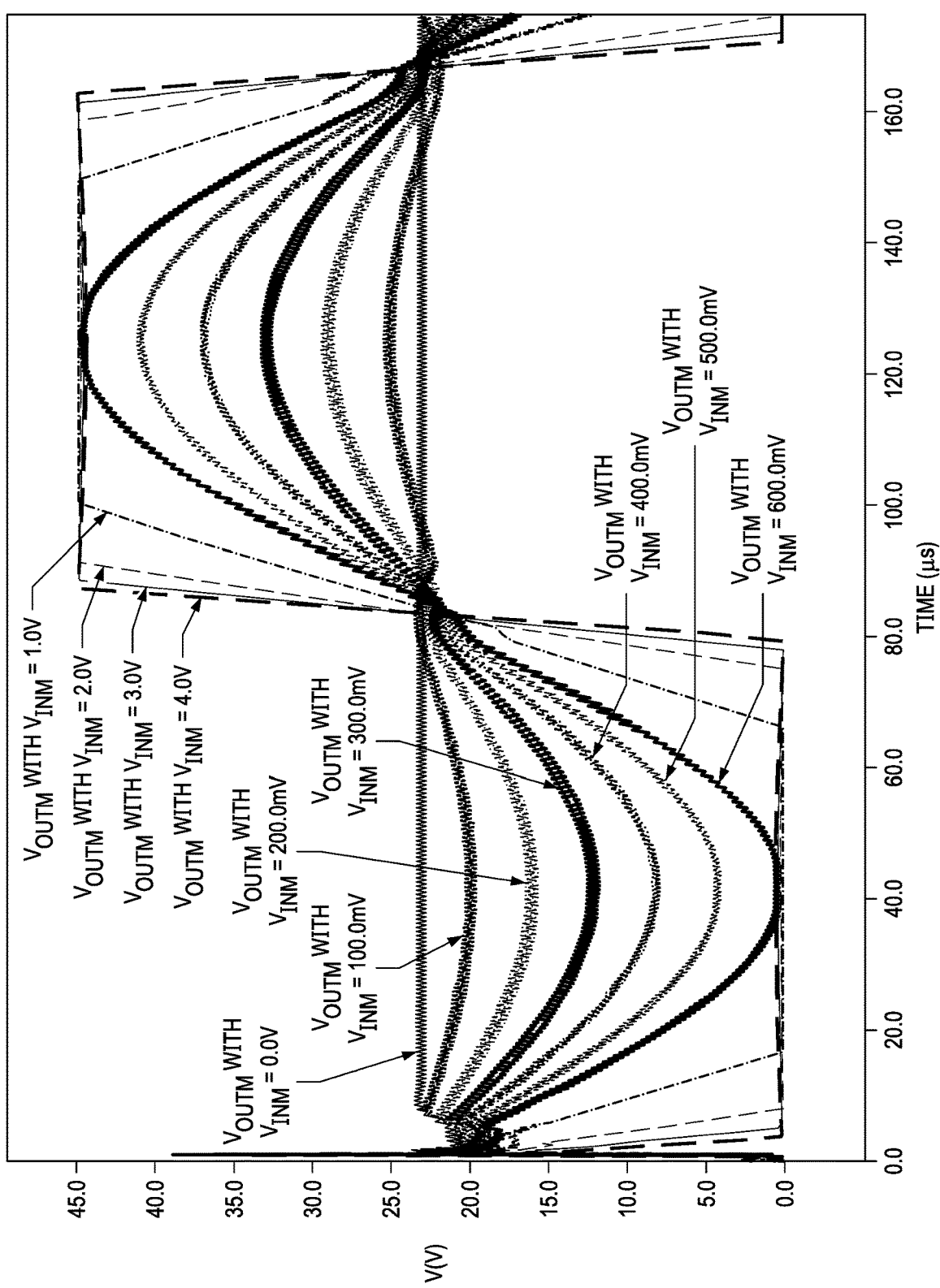
FIG. 10 is a diagram of voltage variance at a second signal output as a function of voltage variance at a second source signal input for a switching amplifier in accordance with an example embodiment.

FIG. 10 is a diagram 1000 of voltage variance at a second signal output (e.g., $V_{OUTM}$ at the second signal output 150 in FIG. 1, or the second signal output 150A in FIG. 2) as a function of voltage variance at a second source signal input ($V_{INM}$ at the second source signal input 142 in FIG. 1, or the second source signal input 142A in FIG. 2) for a switching amplifier (e.g., the switching amplifier 106 in FIG. 1, the switching amplifier 106A in FIG. 1) in accordance with an example embodiment. As shown, for smaller values of $V_{INM}$ (e.g., $V_{INM}$ below 500 mV), $V_{OUTM}$ is approximately sinusoidal and is not clamped. For larger values of $V_{INM}$ (e.g., $V_{INM}$ above 600 mV), $V_{OUTM}$ is approximately trapezoidal is clamped.

Figure 11:
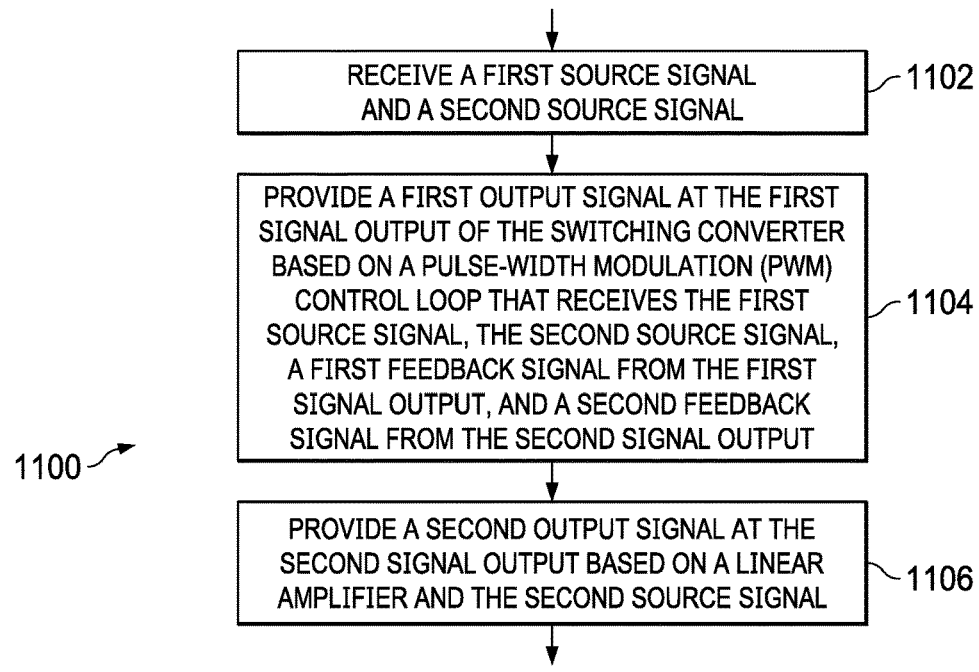
FIG. 11 is a flowchart showing a method for use with a switching amplifier having a first signal output and a second signal output in accordance with an example embodiment.

FIG. 11 is a flowchart showing a method 1100 for use with a switching amplifier (e.g., the switching amplifier 106 in FIG. 1, the switching amplifier 106A in FIG. 1) having a first signal output (e.g., the first signal output 148 in FIG. 1, or the first signal output 148A in FIG. 2) and a second signal output (e.g., the second signal output 150 in FIG. 1, or the second signal output 150A in FIG. 2) in accordance with an example embodiment. As shown, the method 1100 includes receiving a first source signal (e.g., $V_{INP}$) and second source signal (e.g., $V_{INM}$) at block 1102. At block 1104, a first output signal ($V_{OUTP}$) is provided at the first signal output (e.g., the first of the switching converter based on a PWM control loop (e.g., the PWM control loop 110 in FIG. 1, or the PWM control loop 110A in FIG. 2) that receives the first source signal, the second source signal, a first feedback signal (e.g., a feedback signal based on $V_{OUTP}$) from the first signal output, and a second feedback signal (e.g., a feedback signal based on $V_{OUTM}$) from the second signal output. In some example embodiments, providing the first output signal at the first signal output at block 1104 is further based on summing a loop filter output (e.g., the output of the loop filter 202 in FIG. 2) having a feedforward signal that is based on a voltage (e.g., $V_{OUTM}$) at the second signal output. At block 1106, a second output signal (e.g., $V_{OUTM}$) is provided at the second signal output based on a linear amplifier (e.g., the linear amplifier 118 in FIG. 1, or the linear amplifier 118A in FIG. 2).

In some example embodiments, the method 1100 may also include: scaling the first feedback signal relative to the first output signal; and scaling the second feedback signal relative to the second output signal. As another option, the method 1100 may further include coupling the first output signal and the second output signal to a load (e.g., the load 162 in FIG. 1, or the load 162A in FIG. 2) via filter circuitry (e.g., the filter circuitry 160 in FIG. 1, or the filter circuitry 160A in FIG. 2) that includes a first filter (e.g., L1 and C1 in the arrangement shown in FIG. 2 or 3) and a second filter (e.g., C2 in the arrangement shown in FIG. 2 or 3). The first filter is between the first signal output and a first end of the load. In some example embodiments, the first filter includes a first capacitor (e.g., C1 in FIGS. 2 and 3) and an inductor (e.g., L1 in FIGS. 2 and 3). The second filter is between the second signal output and a second end of the load. The second filter includes a second capacitor (e.g., C2 in FIGS. 2 and 3) and no inductor. In some example embodiments, the method 1100 includes selecting a size of the second capacitor and a related charging interval to reduce switching losses of the switching amplifier.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

As used herein, the terms "terminal", "node", "interconnection", "pin", "contact", and "connection" are used interchangeably. Unless specifically stated to the contrary, these terms are generally used to mean an interconnection between or a terminus of a device element, a circuit element, an integrated circuit, a device or other electronics or semiconductor component.

While the example embodiments above utilize nMOS transistors, other example embodiments may utilize pMOS transistors, NPN bipolar junction transistors (BJTs), PNP BJTs, or any other type of transistor. Hence, when referring to a current terminal, such terminal may be an emitter, collector, source or drain. Also, the control terminal may be a base or a gate.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in this description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described embodiments, and other embodiments are possible, within the scope of the claims.

What is claimed is:

1. An apparatus, comprising:
a control circuit having an input, first control outputs, and second control outputs, the control circuit including a filter and a modulation signal generator coupled between the input and the first control outputs and an amplifier coupled between the input and the second control outputs;
a first power stage having first control inputs and a first power stage output, the first control inputs coupled to the first control outputs;
a second power stage having second control inputs and a second power stage output, the second control inputs coupled to the second control outputs.

2. The apparatus of claim 1, wherein the input is a first input, and the control circuit has a second input; and
wherein the filter is a loop filter having a first filter input, a second filter input and a filter output, the first filter input coupled to the first input and the first power stage output, and the second filter input coupled to the second input and the second power stage output.

3. The apparatus of claim 1, wherein the amplifier is a linear amplifier.

4. The apparatus of claim 1, wherein the first power stage has a first power supply terminal, and the second power stage has a second power supply terminal; and
wherein the amplifier is configured to generate control signals to clamp the second power stage output at a voltage of the second power supply terminal.

5. The apparatus of claim 4, wherein the first power stage includes:
a first transistor coupled between the first power supply terminal and the first power stage output, the first transistor having a first control terminal coupled to a first one of the first control inputs; and
a second transistor coupled between the first power stage output and a ground terminal, the second transistor having a second control terminal coupled to a second one of the second control inputs; and
wherein the second power stage includes:
a third transistor coupled between the second power supply terminal and the second power stage output, the third transistor having a third control terminal coupled to a first one of the second control inputs; and
a fourth transistor coupled between the second power stage output and the ground terminal, the fourth transistor having a fourth control terminal coupled to a second one of the second control inputs.

6. The apparatus of claim 1, wherein the first power stage output is coupled to an inductor terminal, and the second power stage output is coupled to a capacitor terminal.

7. The apparatus of claim 1, wherein the control circuit, the first power stage, and the second power stage are part of an integrated circuit.

8. The apparatus of claim 1, wherein the control circuit, the first power stage, and the second power stage are part of an audio amplifier.

9. The apparatus of claim 2, further comprising:
a first resistor coupled between the first input and the first filter input;
a second resistor coupled between the second input and the second filter input;
a third resistor coupled between the first filter input and the first power stage output; and
a fourth resistor coupled between the second filter input and the second power stage output.

10. The apparatus of claim 2, wherein the modulation signal generator is a pulse width modulation signal generator and includes: a summer having a first summer input, a second summer input, and a summer output, the first summer input coupled to the filter output, the second summer input coupled to the second power stage output; and a comparator having a first comparator input, a second comparator input and a comparator output, the first comparator input coupled to the summer output, the second comparator input coupled to a ramp reference terminal, and the comparator output coupled to the first control outputs.

11. A system, comprising:
a control circuit having an input, first control outputs, and second control outputs, the control circuit including a filter and a modulation signal generator coupled between the input and the first control outputs and an amplifier coupled between the input and the second control outputs;
a first power stage having first control inputs and a first power stage output, the first control inputs coupled to the first control outputs;
a second power stage having second control inputs and a second power stage output, the second control inputs coupled to the second control outputs;
an inductor coupled between the first power stage output and a first output; and
a capacitor coupled between the first output and the second power stage output.

12. The system of claim 11, wherein the input is a first input, the control circuit has a second input; and
wherein the filter is a loop filter having a first filter input, a second filter input and a filter output, the first filter input coupled to the first input and the first power stage output, and the second filter input coupled to the second input and the second power stage output.

13. The system of claim 12, wherein the amplifier is a linear amplifier.

14. The system of claim 11, wherein the first power stage has a first power supply terminal, and the second power stage has a second power supply terminal; and
wherein the amplifier is configured to generate control signals to clamp the second power stage output at a voltage of the second power supply terminal.

15. The system of claim 14, wherein the first power stage includes a first transistor coupled between the first power supply terminal and the first power stage output, the first transistor having a first control terminal coupled to a first one of the first control inputs, and a second transistor coupled between the first power stage output and a ground terminal, the second transistor having a second control terminal coupled to a second one of the second control inputs; and
wherein the second power stage include a third transistor coupled between the second power supply terminal and the second power stage output, the third transistor having a third control terminal coupled to a first one of the second control inputs, and a fourth transistor coupled between the second power stage output and the ground terminal, the fourth transistor having a fourth control terminal coupled to a second one of the second control inputs.

16. The system of claim 11, wherein the capacitor is a first capacitor, and the system further comprises a second capacitor coupled between the second power stage output and a ground terminal.

17. The system of claim 11, further comprising a speaker coupled between the first output and the second power stage output.

18. The system of claim 11, wherein the control circuit, the first power stage, and the second power stage are part of an integrated circuit.

19. The system of claim 11, wherein the control circuit, the first power stage, and the second power stage are part of an audio amplifier.

20. The system of claim 12, further comprising:
a first resistor coupled between the first input and the first filter input;
a second resistor coupled between the second input and the second filter input;
a third resistor coupled between the first filter input and the first power stage output; and a fourth resistor coupled between the second filter input and the second power stage output.

21. The system of claim 12, wherein the modulation signal modulator is a pulse with modulation (PWM) signal generator and includes: a summer having a first summer input, a second summer input, and a summer output, the first summer input coupled to the filter output, the second summer input coupled to the second power stage output; and a comparator having a first comparator input, a second comparator input and a comparator output, the first comparator input coupled to the summer output, the second comparator input coupled to a ramp reference terminal, and the comparator output coupled to the first control outputs.

22. A method comprising:
receiving a first signal;
filtering the first signal using a filter;
generating first control signals from the filtered first signal using a modulation signal generator;
generating second control signals from the first signal using an amplifier;
generating a second signal by providing the first control signals to a first power stage; and
generating a third signal by providing the second control signals to a second power stage.

23. The method of claim 22,
wherein generating the first control signals includes generating the first control signals using the second signal as a feedback signal.

24. The method of claim 22, wherein generating the first control signals includes:
generating a summation signal based on a sum between the filtered first signal and the third signal;
comparing the summation signal with a ramp signal to generate a comparison signal; and
generating the first control signals as pulse width modulation signals based on the comparison signals.

25. The method of claim 22,
wherein the amplifier is a linear amplifier.

26. The method of claim 22, further comprising clamping the third signal at a supply voltage.

* * * * *